/ United States Patent (12) Mikami et al.

(10) Patent No.: US 6,791,389 B2
(45) Date of Patent: Sep. 14, 2004

(54) VARIABLE DELAY CIRCUIT AND A TESTING APPARATUS FOR A SEMICONDUCTOR CIRCUIT

(75) Inventors: Hiroyuki Mikami, Tokyo (JP); Yasutaka Tsuruki, Tokyo (JP)

(73) Assignee: Advantest Corporation (JP)

( * ) Notice: Subject to any disclaimer, the term of this patent is extended or adjusted under 35 U.S.C. 154(b) by 137 days.

(21) Appl. No.: 10/306,129

(22) Filed: Nov. 27, 2002

(65) Prior Publication Data

US 2003/0128064 A1 Jul. 10, 2003

Related U.S. Application Data

(63) Continuation of application No. PCT/JP01/04568, filed on May 30, 2001.

(30) Foreign Application Priority Data

May 30, 2000 (JP) ........................................ 2000-160083

(51) Int. Cl.[7] ............................................. H03H 11/26
(52) U.S. Cl. ...................................... 327/276; 327/277
(58) Field of Search ................................ 327/276, 277, 327/284, 158, 161

(56) References Cited

U.S. PATENT DOCUMENTS

| 5,204,564 | A | | 4/1993 | Ochiai | 307/603 |
| 5,420,531 | A | * | 5/1995 | Wetlaufer | 327/270 |
| 6,297,679 | B1 | * | 10/2001 | Kim | 327/276 |
| 6,473,455 | B1 | * | 10/2002 | Kwon | 375/228 |

FOREIGN PATENT DOCUMENTS

| DE | 41 10 340 C2 | 11/1993 | .......... H03K/17/28 |
| JP | 59-5736 | 1/1984 | ............ H03K/5/13 |
| JP | 61-128833 | 6/1986 | |
| JP | 1-175408 | 7/1989 | |
| JP | 5-191233 | 7/1993 | ............ H03K/5/13 |
| JP | 6-45889 | 2/1994 | |

OTHER PUBLICATIONS

Translation of International Preliminary Examination Report dated Aug. 26, 2002, 4 pages.
Patent Abstracts of Japan, Publication No. 05191233 A, published on Jul. 30, 1993, 1 page.
Patent Abstracts of Japan, Publication No. 59005736 A, published on Jan. 12, 1984, 1 page.
German Office Action dated May 13, 2003, 3 pages with Translation, 4 pages.
Patent Abstracts of Japan, Publication No. 06–045889, Publication date Feb. 18, 1994, 2 pages.
Patent Abstracts of Japan, Publication No. 01–175408, Publication date Jul. 11, 1989, 2 pages.

* cited by examiner

Primary Examiner—Linh M. Nguyen
(74) Attorney, Agent, or Firm—Rosenthal & Osha L.L.P.

(57) ABSTRACT

According to the present invention, a variable delay circuit includes a delay circuit unit group, a control unit and an offset delay amount memory group. The delay circuit unit group includes a plurality of delay circuit units, and the plurality of delay circuit units includes two paths having different delay amounts. The offset delay amount memory group includes a plurality of offset delay amount memories, and offset delay amounts corresponding to delay amounts of the first paths of the corresponding delay circuit units are set in the plurality of offset delay amount memories. The control unit includes a plurality of subtracting units, and the plurality of subtracting units select paths of the delay circuit units through which an input signal may pass by using a delay setting value and offset delay amounts. It is possible to reduce volume of the circuit and remove a table since the path is selected by calculation.

12 Claims, 7 Drawing Sheets

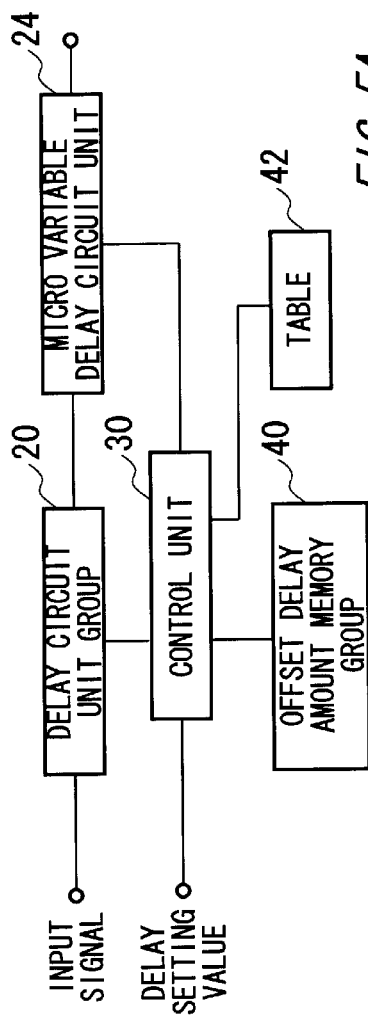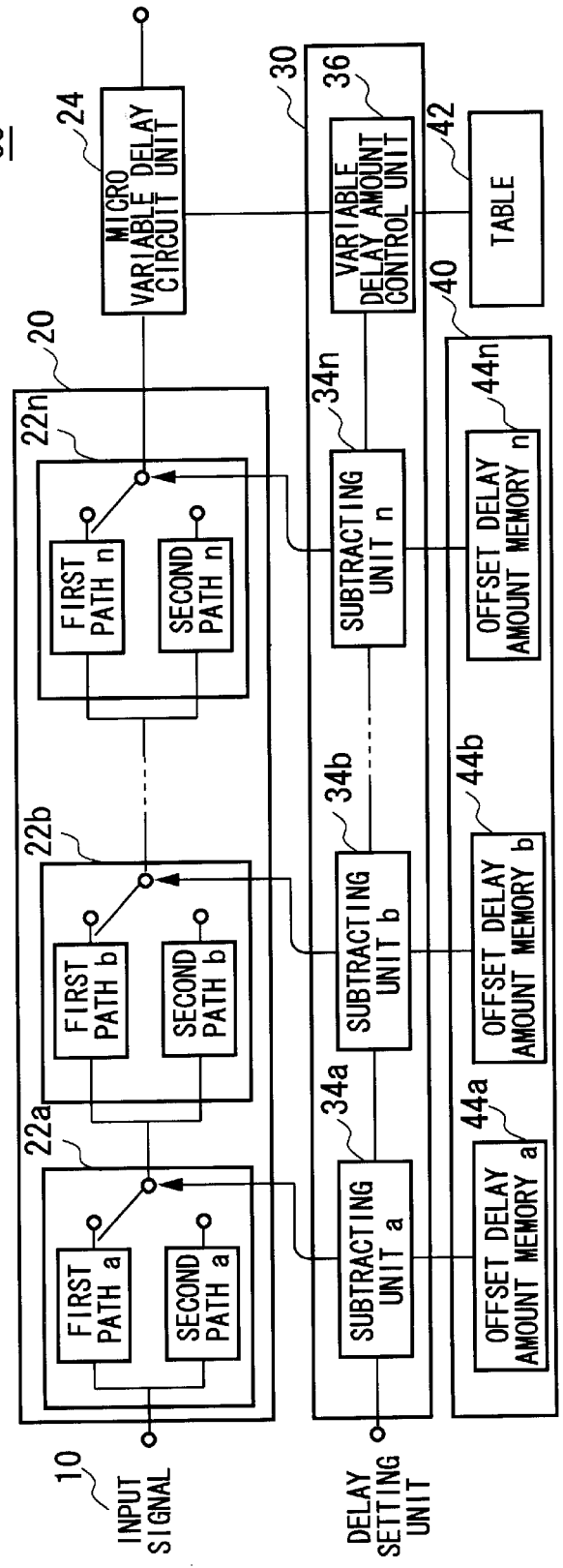
FIG. 5A
FIG. 5B

VARIABLE DELAY CIRCUIT AND A TESTING APPARATUS FOR A SEMICONDUCTOR CIRCUIT

The present invention is a continuation application of PCT application No. PCT/JP01/04568 filed on May 30, 2001 and claims priority from a Japanese patent application No. 2000-160083 filed on May 30, 2000, the contents of which are incorporated herein by reference.

BACKGROUND OF THE INVENTION

1. Field of the Invention

The present invention relates to a variable delay circuit and a testing apparatus for a semiconductor circuit.

2. Description of the Related Art

Recently, a delay error due to signal transmission path of a delay circuit used for a semiconductor testing apparatus cannot be ignored as operation speed of semiconductor circuits become faster. Further, a variable delay circuit of fine resolution requires to have large volume of control table, which causes the volume of delay circuit to become larger. Therefore, it is being demanded to achieve efficient control of the variable delay circuit.

FIG. 1 shows a conventional variable delay circuit 50. The conventional variable delay circuit 50 has a plurality of delay circuit units 22, a table 42 and a plurality of switches 32. A delay setting value 12, which is required delay amount provided from outside (by a user), is inputted to the table 42. And, an input signal 10 is inputted to a first stage delay circuit unit 22a from the outside.

The plurality of delay circuit units 22 respectively has two signal transmission paths, one of which is selected by the switches 32 provided.

The table 42 outputs data for controlling the path changing switches 32 of the delay circuit units 22 in response to the delay setting value 12. The table has data amounts determined by the delay amount of the variable delay circuit 50, delay resolution and the number of stages of the delay circuit units 22. For example, in case the variable delay amount is 8 ns, delay resolution is 125 ps (or 64 gradations) and the number of stages is n stages, a table having data width of 6 (for addressing)+n (for selecting a path at each stage) bits and 64 columns is needed.

According to the variable delay circuit 50 shown in FIG. 1, since each switch 32 of each delay circuit unit 22 is controlled by the control data outputted from the table 42, a large amount of data is stored in the table 42, which in turn makes the volume of the delay circuit 50 large.

SUMMARY OF THE INVENTION

Therefore, it is an object of the present invention to provide a variable delay circuit which is capable of overcoming the above drawbacks accompanying the conventional art. The above and other objects can be achieved by combinations described in the independent claims. The dependent claims define further advantageous and exemplary combinations of the present invention.

According to the first aspect of the present invention, there is provided a variable delay circuit including a delay circuit unit including a first path of a first delay amount and a second path of a second delay amount, wherein an input signal passes through either one of the paths and is outputted; and a control unit for receiving a delay setting value and selecting one path out of the first and second paths by calculating the delay setting value and an offset delay amount corresponding to the first delay amount of the delay circuit unit.

It is possible to reduce the volume of the variable delay circuit since the variable delay circuit does not need to have a table by selecting the path of the delay circuit unit by calculation of the control unit.

According to the first aspect of the present invention, the second delay amount may be substantially zero (0).

The control unit may select the first path in case the offset delay amount is equal to or smaller than the delay setting value, and the second path in case the offset delay amount is larger than the delay setting value, by comparing the offset delay amount with the delay setting value.

According to another embodiment of the first aspect of the present invention, the variable delay circuit includes a plurality of cascaded delay circuit units each of which has a different first delay amount, the control unit includes a plurality of cascaded subtracting units, wherein offset delay amount corresponding to each delay circuit is inputted to each of said subtracting units, and each of the subtracting units receives the delay setting value, and outputs a value, calculated by subtracting the offset delay amount from the delay setting value as a delay setting value for a subtracting unit of the next stage in case the delay setting value is equal to or larger than the offset delay amount, or outputs the delay setting value as a delay setting value for a subtracting unit of the next stage in case the delay setting value is smaller than the offset delay amount.

The plurality of delay circuit units may be cascaded so that the first delay amount of a stage is smaller than that of the previous stage.

A plurality of offset delay amounts, determined to be corresponding to each of selected paths of the delay circuit units in the upstream, may be set for each of the first delay amounts.

The control unit may calculate by using one offset delay amount corresponding to a combination of selected paths of the delay circuit units in the upstream out of a plurality of offset delay amounts set for each of the first delay amounts.

According to another embodiment of the first aspect of the present invention, the variable delay circuit may include a micro variable delay circuit unit which can produce a variable delay amount, which is equal to or smaller than a predetermined first delay amount out of the first delay amounts, and a table for storing data which control the delay amount of the micro variable delay circuit unit.

The control unit may select a path of the delay circuit unit, refer to the data of the table, control the delay amount of the micro variable delay circuit unit and delay the input signal for a predetermined time.

According to a second aspect of the present invention, there is provided a testing apparatus for testing a semiconductor circuit including: a signal generator for generating test signals; a variable delay circuit for providing the test signals outputted from the signal generator with a predetermined timing; and a determining unit for determining whether or not the semiconductor circuit has passed a test based on outputted signals from the semiconductor circuit, wherein the variable delay circuit includes a delay circuit unit including a first path of a first delay amount and a second path of a second delay amount, wherein an input signal passes through either one of the paths and is outputted; and a control unit for receiving a delay setting value and selecting one path out of the first and second paths by calculating the delay setting value and an offset delay amount corresponding to the first delay amount of the delay circuit unit.

The above summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIGS. 5A and 5B show a detailed diagram of another example of the variable delay circuit shown in FIGS. 2B and 3.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

FIG. 2 is a block diagram showing a structure of a variable delay circuit 60 according to a first embodiment of the present invention. The variable delay circuit 60 can produce a delayed output signal with a predetermined delay time according to a delay setting value 12 from an input signal 10.

Figure 1:
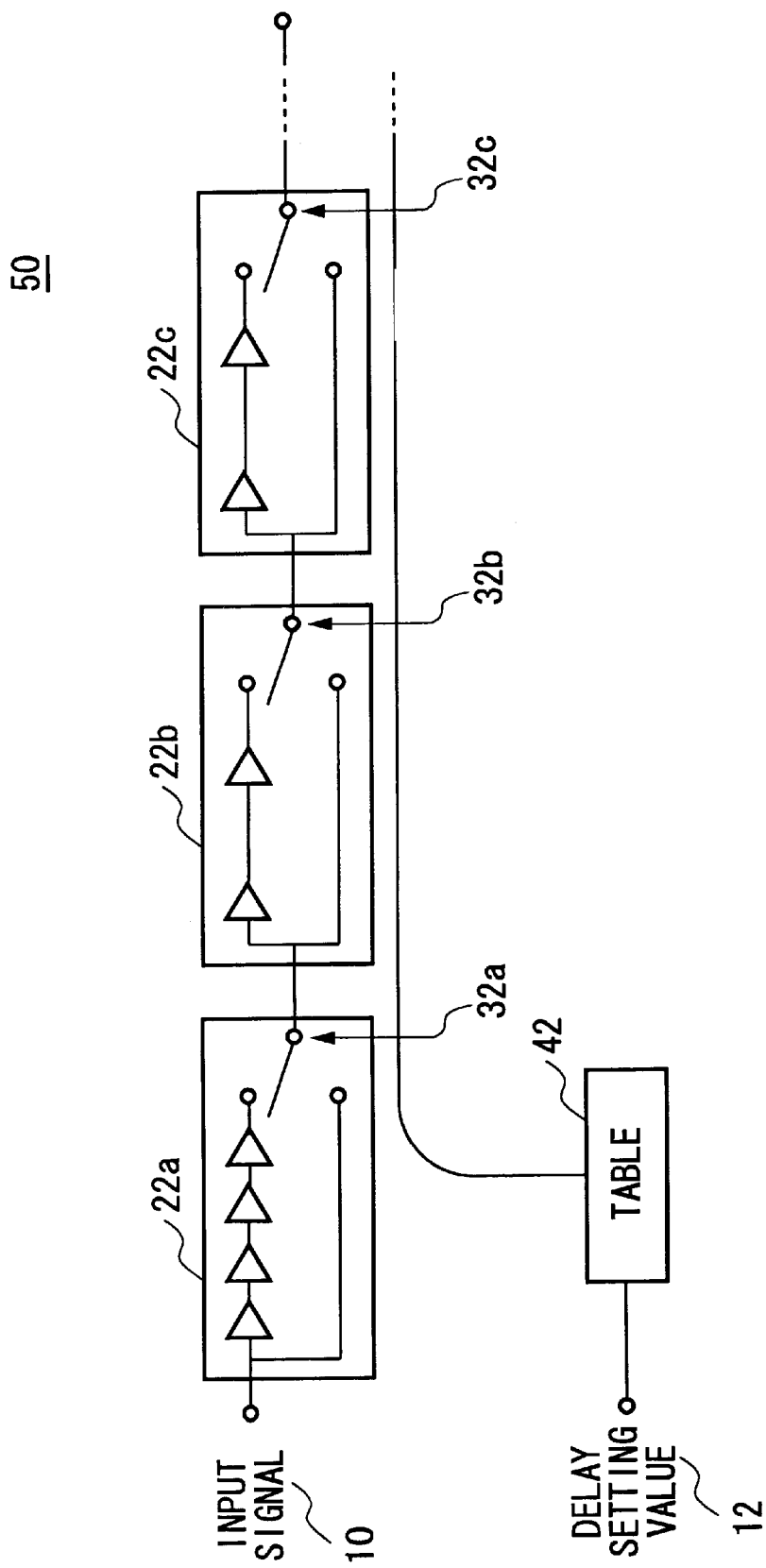
FIG. 1 shows a conventional variable delay circuit.
Figure 2A:
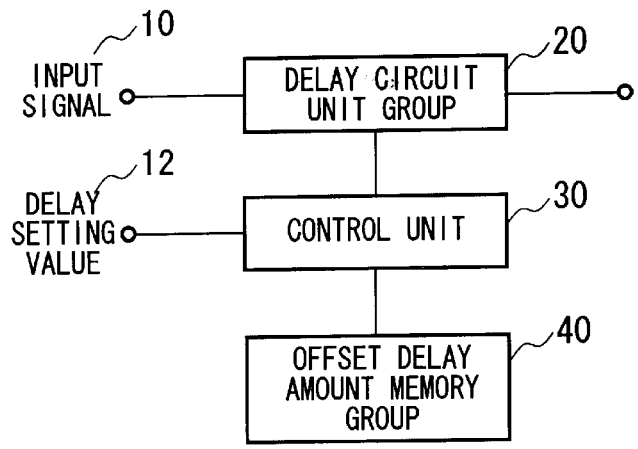
FIGS. 2A and 2B are block diagrams showing a variable delay circuit according to an embodiment of the present invention.

FIG. 2A shows an example of a structure of the variable delay circuit 60 according to the first embodiment of the present invention. The variable delay circuit 60 includes a delay circuit unit group 20, a control unit 30 and an offset delay amount memory group 40.

The delay circuit unit group 20 includes one or a plurality of delay circuit unit. Each delay circuit unit includes a first and a second paths having a first and a second delay amounts, respectively. The input signal 10 passes through either one of the first and second paths to be outputted.

The control unit 30, to which the delay setting value 12 is inputted, compares an offset delay amount corresponding to a first delay amount of a delay circuit unit with the delay setting value 12 and controls a switch of a delay circuit unit to select a transmission path of the input signal 10 out of the first and second paths.

The offset delay amount memory group 40 includes a plurality of offset delay amount memories. The offset delay amount memory stores offset delay amounts, each of which corresponds to the first delay amount of each of the plurality of delay circuit units. According to an embodiment of the present invention, the second delay amount may be substantially zero (0).

Figure 2B:
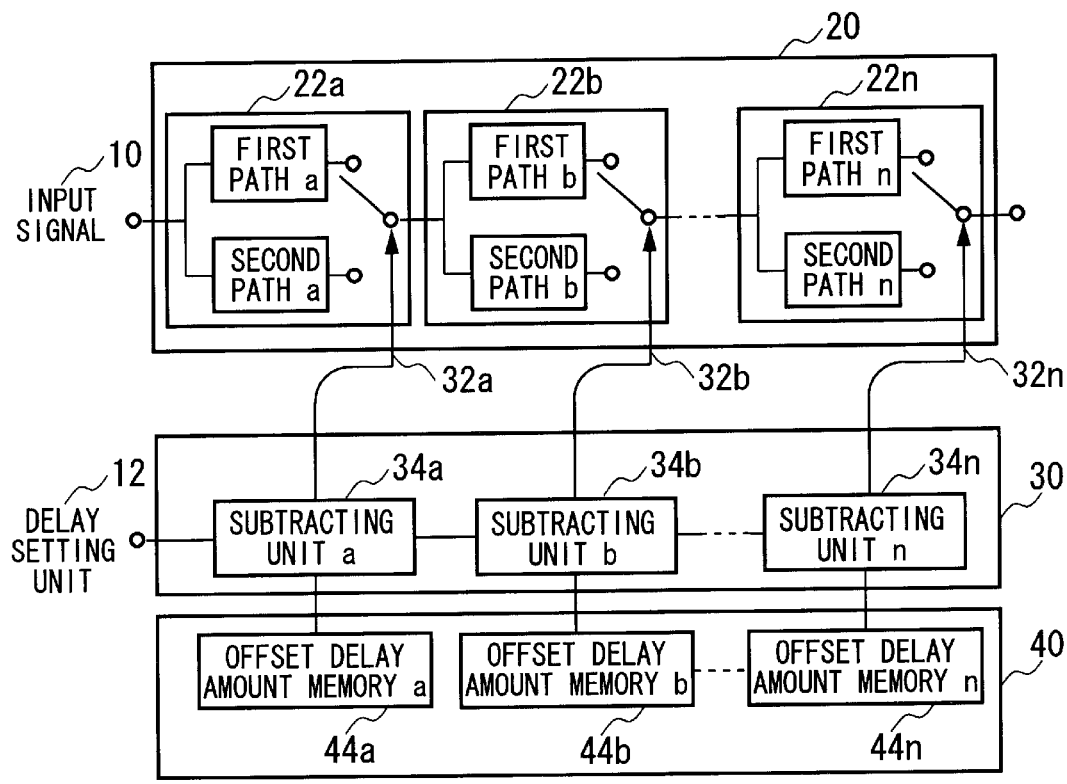

FIG. 2B shows a detailed block diagram showing a structure of the variable delay circuit 60 described above with reference to FIG. 2A. The variable delay circuit 60 includes a delay circuit unit group 20, a control unit 30 and an offset delay amount memory group 40.

The delay circuit unit group 20 includes a plurality of delay circuit units 22a to 22n. Each of the plurality of delay circuit units 22a to 22n includes a first and a second paths respectively having a first and a second delay amounts and a switch for selecting either one of the first and second paths. The plurality of delay circuit units 22a to 22n respectively have different first delay amounts, and are preferably coupled to one another in cascade. According to another embodiment, each of the plurality of delay circuit units 22a to 22n may have a minimum delay resolution as the first delay amount. In another arrangement or modification, some of the plurality of delay circuit units 22a to 22n may have the same first delay amount. Further, of each of the plurality of delay circuit units 22a to 22n may be preferably coupled to a prior delay circuit unit in cascade so that each of the first delay amounts of each of the plurality of delay circuit units 22a to 22n becomes smaller than that of the prior delay circuit unit.

Each of the first delay amounts of each of the plurality of delay circuit units 22a to 22n may be about a half of that of the prior delay circuit unit. In case each of the first delay amounts is about a half of that of the prior delay circuit unit, the variable delay circuit 60 can effectively produce consecutive delay amounts from the maximum to the minimum by a difference of a predetermined delay resolution.

The offset delay amount memory group 40 includes offset delay amount memories 44a to 44n respectively provided to the plurality of delay circuit units 22a to 22n. Each of the plurality of offset delay amount memories 44a to 44n stores an offset delay amount corresponding the first delay amount of each of the plurality of delay circuit units 22a to 22n.

The control unit 30 includes a plurality of subtracting units 34a to 34n respectively provided to the plurality of delay circuit units 22a to 22n. Each offset delay amount corresponding to each of the plurality of delay circuit units 22a to 22n is inputted to each of the plurality of subtracting units 34a to 34n. The plurality of subtracting units 34a to 34n are coupled to one another in series. Each subtracting unit, to which delay setting value is inputted, outputs subtracted value as a delay setting value of the next stage by subtracting the offset delay amount from the inputted delay setting value in case the inputted delay setting value is equal to or larger than the offset delay amount. On the other hand, in case the inputted delay setting value is smaller than the offset delay amount, each subtracting unit outputs the inputted delay setting value as that of the next stage.

Each of the subtracting units 34a to 34n compares the offset delay amount and the delay setting value 12, and preferably selects the first path in case the offset delay amount is equal to or smaller than the delay setting value 12 or the second path in case the offset delay amount is larger than the delay setting value 12. The switch 32 performs selection of the path.

The delay circuit unit group 20 and the offset delay amount memory group 40 shown in FIG. 2B include a plurality of delay circuit units 22a to 22n and a plurality of offset delay amount memories 44a to 44n. According to another embodiment of the present invention, the delay circuit unit group 20 and the offset delay amount memory group 40 may include one delay circuit unit and one offset delay amount memory, respectively.

According to the present embodiment, a plurality of subtracting units 34a to 34n are respectively provided to and select paths of the corresponding delay circuit units 22a to 22n in turn. However, according to another embodiment of the present invention, one calculating unit (not shown) may select paths of a plurality of delay circuit units 22a to 22n by a calculation performed in advance. For example, each path of each delay circuit unit 22 is determined by calculation in advance, the result of the calculation is outputted to, such as, a register, and each switch 32 is operated accordingly. A plurality of calculating units may be used to select order of paths of a plurality of delay circuit units 22a to 22n by calculating simultaneously. Further, calculation by the calculating unit may not be a subtraction.

According to the present embodiment shown in the drawing, it is preferable to set the first delay amount of a delay circuit unit to be smaller than that of a delay circuit unit of the prior stage. However, in case the plurality of calculation units select paths of the plurality of delay circuit units 22a to 22n by calculating simultaneously, values of the first delay amounts of the plurality of delay circuit units 22a to 22n may be random.

According to the variable delay circuit 60 of a first embodiment of the present invention described with reference to FIGS. 2A and 2B, the conventional table is not needed and volume of the circuit can be small because path selection of each of the delay circuit units 22a to 22n is performed by operation of the control unit instead of using the table.

Figure 3:
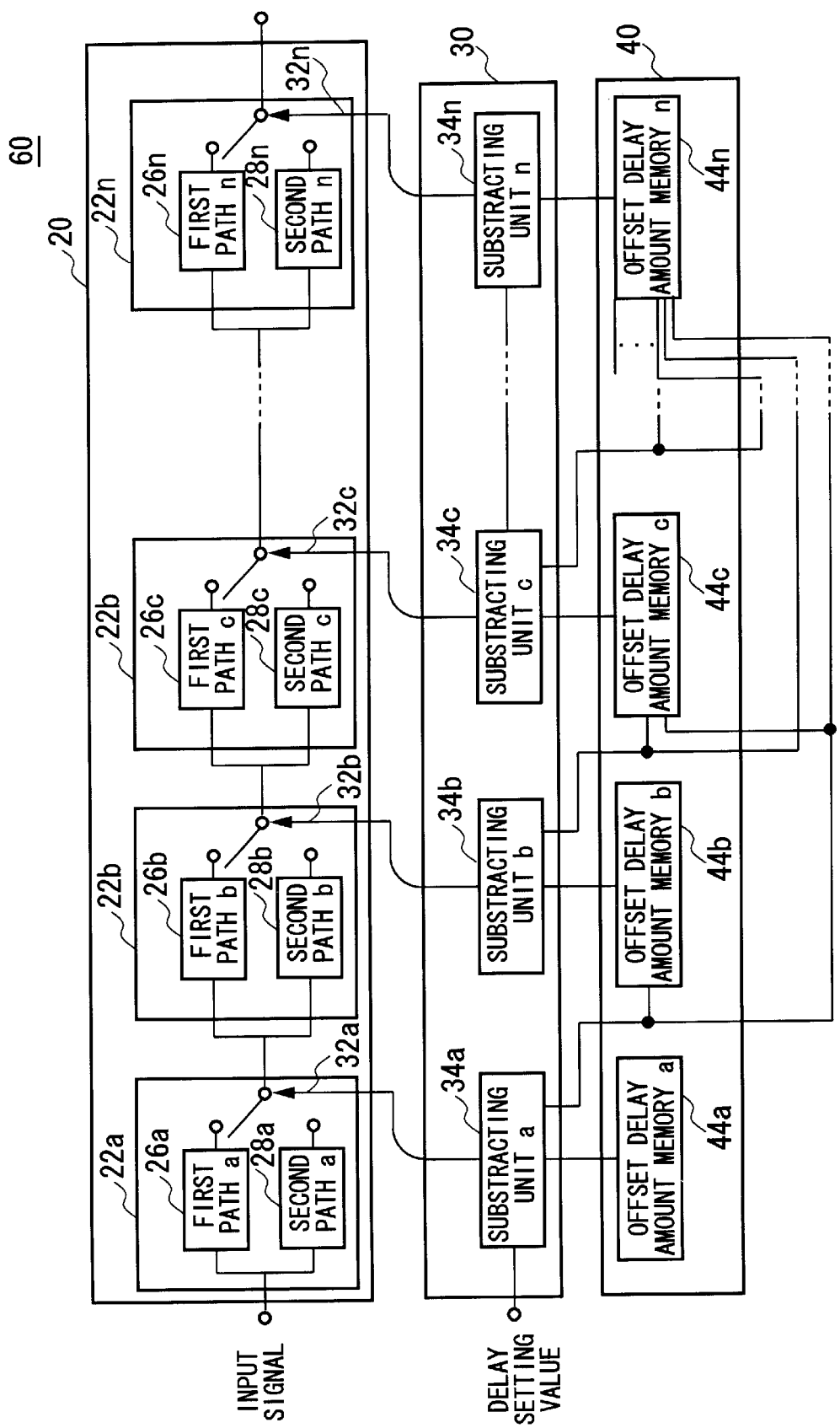
FIG. 3 is a diagram showing an example of the variable delay circuit shown in FIG. 2B more precisely.

FIG. 3 is a block diagram showing a structure of a variable delay circuit 60 according to a second embodiment of the present invention. In FIG. 3, elements designated by the same reference numbers used in FIG. 2b have the same or similar operations and/or functions.

As shown in FIG. 3, an offset delay amount memory group 40 includes a plurality of offset delay amount memories 44. A plurality of offset delay amounts are set for the first delay amounts of the corresponding delay circuit units 22a to 22n in the plurality of offset delay amount memories 44. Each of the plurality of offset delay amounts is determined for a selected path in regard to a delay circuit unit provided in the upper stream of the first path of the corresponding delay circuit unit.

Output signal of each delay circuit unit 22 has a different waveform of different timing according to signal transmission path, through which an input signal of the upstream delay circuit unit has passed, selected out of the first and second paths. Output signal of each delay circuit unit 22 is inputted to a delay circuit unit 22 of the next stage. Here, since an output signal of a delay circuit unit 22 outputted to a delay circuit unit of the next stage has different waveform due to the path through which it has passed, an error is produced in the delay amount of the delay circuit unit 22. The error in the delay amount is described in detail with reference to FIG. 4.

Figure 4A:
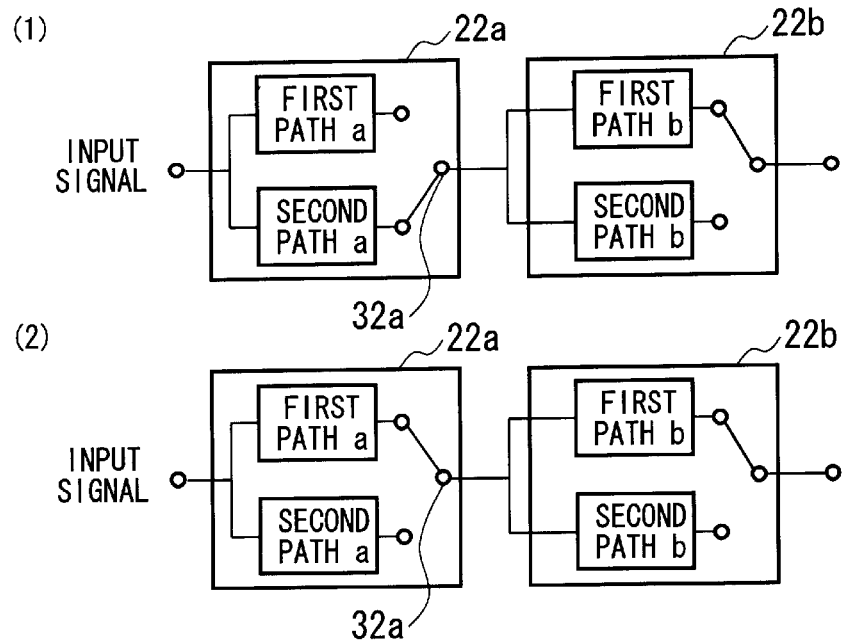
FIG. 4A shows a couple of delay circuit units and FIG. 4B shows different waveforms due to different signal transmission paths.
Figure 4B:
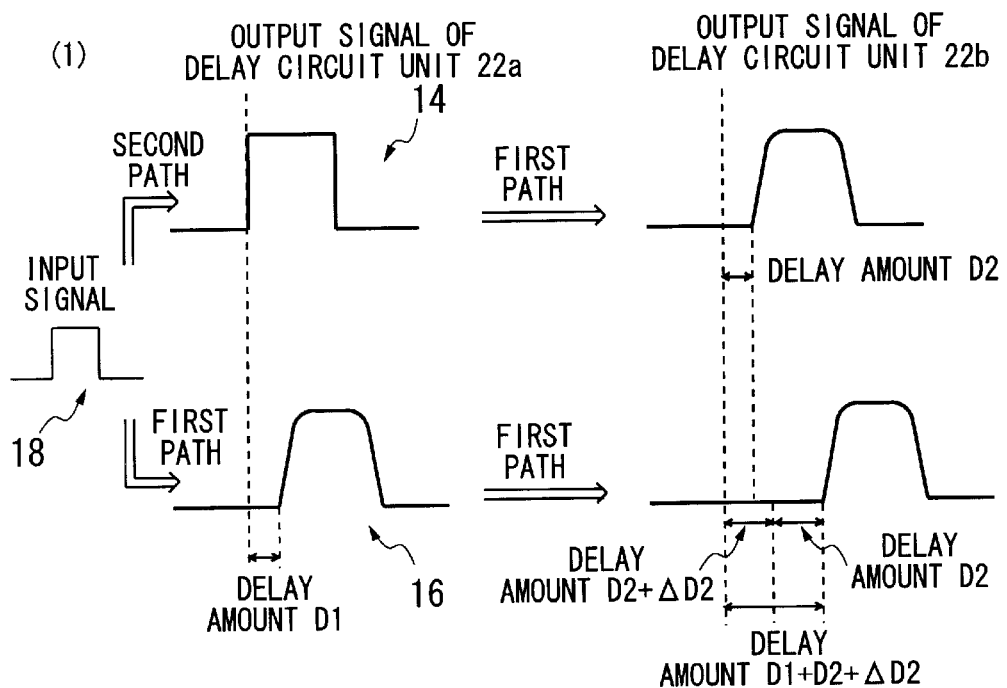

FIGS. 4A and 4B show waveforms used to describe difference in shapes of the waveforms and errors in the delay amounts due to the paths through which signals have passed in the upper streams of the delay circuit units.

FIG. 4A shows paths of delay circuit units 22 through which input signals pass. As shown in FIG. 4A(1), an input signal passes through the second path of the delay circuit unit 22a and the first path b of the delay circuit unit 22b. As shown in FIG. 4A(2), an input signal passes through the first path a of the delay circuit unit 22a and the first path b of the delay circuit unit 22b. In FIG. 4A each delay amount of the second path of each delay circuit unit 22a or 22b is substantially zero (0).

FIG. 4B shows waveforms and differences in delay amounts of an input signal due to the path of the delay circuit in the upstream through which it has passed. In case the input signal has passed through the path shown in FIG. 4A(1), the delay amount of the delay circuit unit 22a is substantially zero, and the output waveform 14 of the delay circuit unit 22a is not substantially changed from the input waveform 18. In case the input signal has passed through the path shown in FIG. 4A(2), the output waveform 16 has a blunter shape than the input waveform 14 because the rising and falling times become longer by the first path of the delay circuit unit 22a.

Now expected delay amounts of the first paths of the delay circuit units 22a and 22b are represented as D1 and D2, respectively. In case the input signal has passed through the path shown in FIG. 4A(1), the total expected delay amount is D2. In the delay circuit unit 22a, the delay amount produced is zero because the input signal has passed the second path a. In the delay circuit unit 22b, the delay amount produced is D2 because the input signal has passed through the first path b. Since the waveform 14 is substantially not changed from the input waveform 18, the delay amount produced by the delay circuit unit 22b substantially does not have error in regard to the expected delay amount.

In case the input signal has passed through the path shown in FIG. 4A(2), the total expected delay amount is D1+D2. In the delay circuit unit 22a, the delay amount is D1 because the input signal has passed the first path. In the delay circuit unit 22b, the delay amount actually produced has error of $\Delta D2$ in regard to the expected delay amount D2 due to the change of waveform. That is to say, the total delay amount produced is $D1+D2+\Delta D2$, which has error of $\Delta D2$ in regard to the expected delay amount of D1+D2. It is described two delay circuit units are cascaded in two stages with reference to FIG. 4, this is also applicable to cases where more delay circuit units are cascaded.

To be concrete, in case the delay circuit units are cascaded in three stages as shown in FIG. 3, the input signal to the delay circuit unit 22c has different waveform according to the paths of the delay circuit units 22a and 22b in the upstream. The delay circuit unit 22a has two paths of the first and second paths 26a and 28a, and the delay circuit unit 22b has two paths of the first and second paths 26b and 28b. Therefore, there are four (4) possible paths for the input signal to the delay circuit unit 22c, which results in different waveforms due to the path actually passed. As a result, the input signal to the delay circuit unit 22c has different delay amount due to the path actually passed.

In case the delay circuit units 22 are cascaded inn stages, there are $2^{n-1}$ possible paths for the input signal to the final delay circuit unit, which also results in different waveforms. When a signal of a different waveform passes a delay circuit unit, the actual delay amount produced is different due to the different waveform. Therefore, each delay amount of a signal, which has passed different path, produced by a delay circuit is different from one another, which results in an error in delay amount in regard to the expected delay amount.

For this reason, the offset delay amount, set in each offset delay amount memory of variable delay circuit 60 shown in FIG. 3, is set to compensate the error of the delay amount due to the first path of each corresponding delay circuit unit, where the error in the delay amount is produced by the upstream path through which a signal has passed.

Further, it is preferable to set $2^{n-1}$ kinds of offset delay amounts for the n-th offset delay amount memory 44n by referring to each and every combination of possible upstream paths through which the input signal may pass.

For example, the offset delay amount memory 44a has one offset delay amount corresponding to the first delay amount of the first delay circuit unit 22a. The offset delay amount memory 44b has two offset delay amounts corresponding to the first delay amounts determined in accordance with the first and second paths 26a and 28a of the delay circuit unit 22b through which the input signal may pass, respectively. Similarly, the offset delay amount memory 44n may preferably have $2^{n-1}$ offset delay amounts since there are $2^{n-1}$ possible paths in the upstream through which the input signal may pass.

The offset delay amounts stored in offset delay amount memories 44 are set in regard to the n-th offset delay amount memory 44n, so that it is possible to achieve a variable delay circuit which can produce an exact delay amount in regard to the expected delay amount.

According to another embodiment of the present invention, in case there are errors of the same value out of a plurality of errors to be compensated for a plurality of paths, it may be preferable to set an offset delay amount to be corresponding to a plurality of errors, which have substantially the same value, of the delay amounts. That is to say, the number of offset delay amounts stored in the offset delay amount memories 44 is smaller than $2^{n-1}$ for the n-th offset delay amount memory. By this, it is possible to save capacities of offset delay amount memories compared to the case of having all of $2^{n-1}$ values and to produce more accurate delay than the case of having only one offset delay amount set in each offset delay amount memory.

The control unit 30 of the variable delay circuit 60 shown in FIG. 3 further includes a plurality of subtracting units 34. The control unit 30 preferably performs its calculation by using one offset delay amount corresponding selected path for each of the delay circuit units 22 in the upstream in regard to the first path of the delay circuit units 22 out of a plurality of offset delay amounts.

According to the second embodiment of the present invention, the variable delay circuit 60 compensates errors in delay amounts for every delay circuit unit and produces delay amounts with high precision in regard to desired delay amounts by setting offset delay amount for each upstream path through which the signal has passed.

FIGS. 5A and 5B are block diagrams showing a structure of a variable delay circuit 60 according to a third embodiment of the present invention. FIG. 5A shows an example of a structure of the variable delay circuit 60 according to the third embodiment of the present invention. The variable delay circuit 60 includes a delay circuit unit group 20, a control unit 30, an offset delay amount memory group 40, a table 42 and a micro variable delay circuit unit 24.

The delay circuit unit group 20 and the offset delay amount memory group 40 have substantially the same structures, operations and functions with the delay circuit unit group 20 and the offset delay amount memory group 40 of the variable delay circuit 60 described with reference to FIG. 3.

The micro variable delay circuit unit 24 can produce a variable delay amount equal to or smaller than a predetermined first delay amount out of the first delay amounts of the delay circuit units of the delay circuit unit group 20. Further, the table 42 stores data for controlling the delay amount of the micro variable delay circuit unit 24. The control unit 30 controls each path of each delay circuit unit of the delay circuit unit group 20 by using the offset delay amounts stored in the offset delay amount memory group 40, and the variable delay amount of the micro variable delay circuit unit 24 by referring to the data of the table 42.

FIG. 5B shows an example of a detailed structure of the variable delay circuit 60 described with reference to FIG. 5A. The variable delay circuit 60 includes a delay circuit unit group 20, a control unit 30, an offset delay amount memory group 40, a table 42 and a micro variable delay circuit unit 24.

The delay circuit unit group 20 and the offset delay amount memory group 40 have substantially the same structures, operations and functions with the delay circuit unit group 20 and the offset delay amount memory group 40 of the variable delay circuit 60 described with reference to FIG. 3.

The micro variable delay circuit unit 24, the control unit 30 and the table 42 have substantially the same structures, operations and functions with the micro variable delay circuit unit 24, the control unit 30 and the table 42 described with reference to FIG. 5A. According to the variable delay circuit 60 of the present embodiment, the control unit 30 selects each path of each delay circuit unit included in the delay circuit unit group 20 and controls the delay amount of the micro variable delay circuit unit 24 by referring to the data of the table 42, thereby the input signal 10 is delayed by a predetermined time.

Although according to the embodiment shown in the drawing, the variable delay circuit 60 includes a plurality of delay circuit units 22, subtracting units 34 and offset delay amount memories 44, it is also preferable to have only one of them in the variable delay circuit 60 according to another embodiment.

Further, although according to the present embodiment, the micro variable delay circuit unit 24 may produce a variable delay amount equal to or smaller than a predetermined first delay amount out of the first delay amounts of the delay circuit units in the delay circuit unit group 20, it is also preferable for the micro variable delay circuit unit 24 to be able to produce a variable delay amount equal to or smaller than the minimum delay amount out of the first delay amounts of the delay circuit units 22 in the delay circuit unit group 20.

The input signal into micro variable delay circuit unit 24 has a different waveform according to the path, through which it has passed, of the plurality of delay circuit units in the delay circuit group 20, which results in error in delay amount of the micro variable delay circuit unit 24. A variable delay amount control unit 36 may preferably calculate delay setting value inputted into the variable delay amount control unit 36 and refer data of the table 42 in order to compensate the error in delay amount due to the difference in signal waveform.

In case the subtracting units 34a to 34n and the offset delay amount memories 44a to 44n have the same structures with the subtracting units 34a to 34n and the offset delay amount memories 44a to 44n described with reference to FIG. 3B, the offset delay amount selected for the offset delay amount memory 44 is used to determine through which path the signal inputted into the micro variable delay circuit unit 24 has passed in regard to the plurality of delay circuit units 22 of the delay circuit group 20. The variable delay control unit 36 may preferably calculate a delay setting value by a coefficient determined by the offset delay amount selected for the offset delay amount memory 44n, and refer to data of the table 42.

According to the third embodiment of the present invention, the variable delay circuit 60 can reduce size of the delay circuit units 22 compared to the variable delay circuit 60 of the second embodiment of the present invention, and volume of the table compared to the conventional variable delay circuit 50 by providing the delay circuit unit group 20, which determines the delay amount by calculation, and the micro variable delay circuit unit 24, which determines the delay amount by referring to the table 42.

Figure 6:
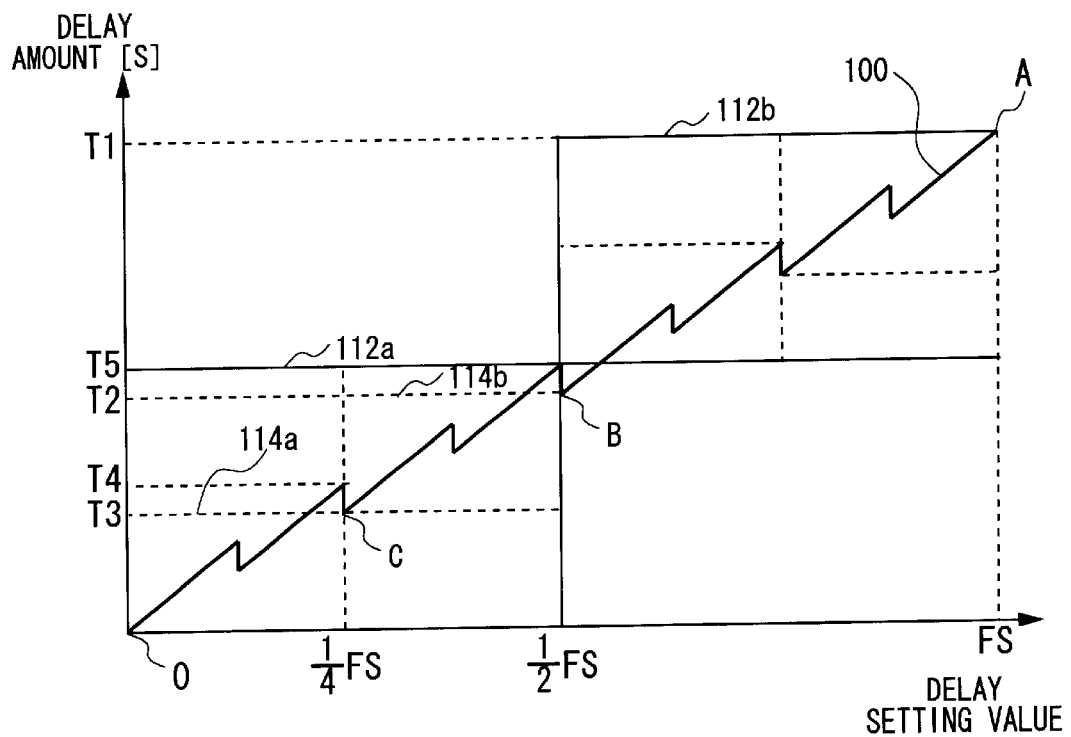
FIG. 6 shows a relation ship between delay setting value and delay amount of variable delay circuit.

FIG. 6 shows an example of a relationship between the delay setting value and the delay amount of the variable delay circuit 60 according to the present invention. In FIG. 6, X-axis has delay setting values, and Y-axis has delay amounts and delay-relationship line 100 shows the relationship between them. Point A on the delay-relationship line 100 represents a delay amount T1 for the maximum delay setting value FS of the variable delay circuit 60. Point B, point C and point O respectively represent a delay amount T2 for the delay setting value of a half of the maximum delay setting value FS, a delay amount T3 for the delay setting value of a quarter of the maximum delay setting value FS and a delay amount for the delay setting value of zero (0).

The conventional variable delay circuit stores all relationships between all delay setting values and all delay amounts from points O to A as data in the table. According to the variable delay circuit 60, a part or all of the relationships between the delay setting value and the delay amount ranging from points O to A is acquired by calculation, thereby the volume of the table is reduced substantially or completely.

As an example, the delay-relationship line 100 is divided into a portion 112a ranging from points O to B and another portion 112b ranging from points B to A. In case the variable delay circuit 60 includes a delay circuit unit having delay amount T2 for the first path and the micro variable delay circuit unit, the micro variable delay circuit unit produces a delay of the maximum delay amount T5 (=T1−T2) for this embodiment. The micro variable delay circuit unit is controlled by a table storing control data which produce delays of up to the maximum delay amount T5 with a predetermined delay resolution. The portion 112a of the delay-relationship line 100 represents relationships between the delay amounts of the micro variable delay circuit unit and the delay setting value, and the portion 112b of the delay-relationship line 100 represents a delay of T2 produced by calculation of the delay circuit unit and additionally relationships between delay amounts produced by the micro variable delay circuit unit and the delay setting values. Therefore, the portions 112a and 112b of the delay-relationship line have substantially the same shape.

According to the present embodiment, the delay circuit unit selects the second paths having delay amount of zero (0), and the micro variable delay circuit unit produces delays of delay amounts ranging from zero (0) to T5 in regard to the portion 112a of the line 100. However, in regard to the portion 112b of the line 100, the delay circuit unit selects the first paths having delay amount T2, and the micro variable delay circuit unit produces delays of delay amounts ranging from zero (0) to T5. As described above, in case the delay-relationship line 100 is divided in to two portions, the variable delay circuit 60 can produce delay shaving delay amounts ranging from zero (0) to T1 by using the micro variable delay circuit unit, which produces delays of delay amounts ranging from zero (0) to T5, and the delay circuit unit, which produces a delay having either delay amount of zero (0) or T2. As described above, switching of the signal transmission path of the delay circuit unit is determined by the calculation.

According to conventional technology, control data for producing delays of delay amounts ranging from zero (0) to T1 is required to be stored in a table, but, according to the present invention, it may be enough to store control data for delay amounts ranging from zero (0) to T5 in a table. Therefore, according to the present embodiment, the amount of data required to be stored in a table may be decreased to a half of that for the conventional technology, thereby it is possible to make the volume of the variable delay circuit 60 smaller.

Similarly, the portion 112a may be divided into portion 114a from points O to C and portion 114b from points C to B. Further, also similarly, the portion 112b is divided into two portions. According to the present embodiment, the variable delay circuit 60 includes a delay circuit unit having a delay amount of T2 for the first path, a delay circuit unit having a delay amount of T3 for the first path and a micro variable delay circuit unit having the maximum delay amount of T4 (=T5−T3). The portion 114a represents relationships between the delay amounts of the micro variable delay circuit unit and the delay setting value, and the portion 114b represents a delay of T3 produced by the delay circuit unit having delay amount of T3 and additionally relationships between delay amounts produced by the micro variable delay circuit unit and the delay setting values. Therefore, the portions 114a and 114b of the delay-relationship line have substantially the same shape.

According to the present embodiment, either set of delay amount(s) of '0, t3 and T2' or 'T3+T2' is produced according to combination of the first and second paths of the two delay circuit units through which the signal may pass, and the micro variable delay circuit unit produces delay amounts of zero (0) to T4. As described above, in case the delay-relationship line is divided into four (4) portions, the variable delay circuit 60 can produce delays of delay amounts ranging from zero (0) to T1 by using the micro variable delay circuit unit producing delays of delay amounts of zero (0) to T4, the delay circuit unit producing a delay of delay amount of either T2 or zero (0) and the delay circuit unit producing a delay of delay amount of either T3 or zero (0). As described above, switching of the signal transmission path of the delay circuit unit is determined by the calculation. According to the present embodiment, the amount of data required to be stored in a table maybe decreased to a quarter of that for the conventional technology, thereby it is possible to make the volume of the variable delay circuit 60 further smaller.

Similarly, if the delay-relationship line 100 is divided into eight (8) portions, it is possible to produce delays of delay amounts of zero (0) to T1 by using three delay circuit units and a micro variable delay circuit unit. In this case, the amount of data required to be stored in a table may be decreased to one eighth of that for the conventional technology.

Further, it is also possible to divide the delay-relationship line 100 by using the delay resolution of the variable delay circuit 60. In this case, the variable delay circuit 60 does not require the table and can produce variable delays of delay amounts ranging from zero (0) to T1 only by calculation. Referring to FIG. 6, it is described each portion of the line 100 is divided into half of it, but it may also be possible to divide each portion into random number of sub-portions.

Figure 7:
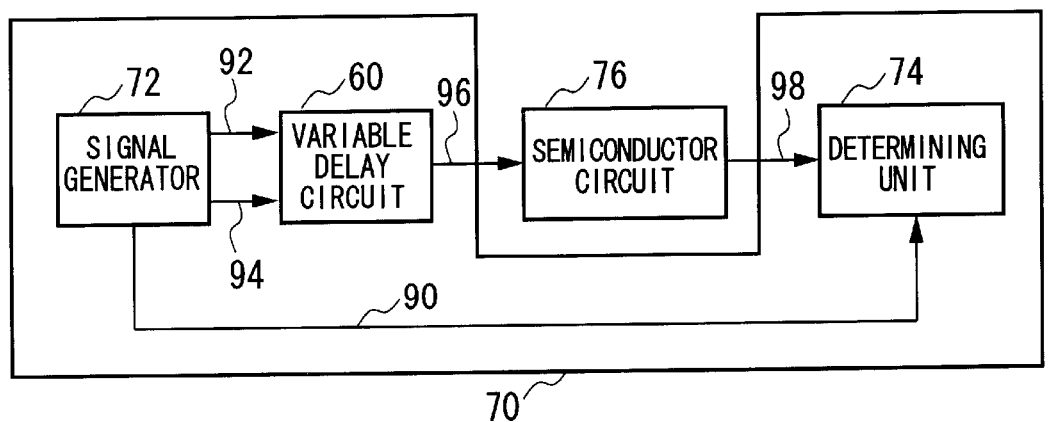
FIG. 7 a block diagram of an embodiment of a testing apparatus having a variable delay circuit shown in FIGS. 2 to 5 according to the present invention.

FIG. 7 shows an example of a structure of a testing apparatus 70 according to a fourth embodiment of the present invention. The testing apparatus 70 includes a signal generating unit 72, a variable delay circuit 60 and a determining unit 74.

The signal generator 72 generates test pattern data 92 inputted into a semiconductor circuit 76, and expectation data 90 outputted from the semiconductor circuit 76 to which the test pattern data is inputted. The signal generator 72 outputs the test pattern data 92 to the variable delay circuit 60, and the expectation data 90 to the determining unit 74. Further, the signal generator 72 outputs to the variable delay circuit 60 a delay setting value 94 determined to be in response to operation characteristics of the semiconductor circuit 76.

The variable delay circuit 60 outputs the test pattern data 92, which is delayed in response to the delay setting value 94, to the semiconductor circuit 76 as output signal 96. The determining unit 74 determines whether or not the semiconductor circuit 76 passes the test by comparing the output signal 98 from the semiconductor circuit 76 and the expectation data 90 provided by the signal generator 72.

The variable delay circuit 60 includes a delay circuit unit, which includes a first path of a first delay amount and a second path of a second delay amount and outputs an input signal passing through either the first or second path, and a control unit which determines a signal passing path out of the first and second paths of the delay circuit unit by calculating an offset delay amount corresponding to the first delay amount of the delay circuit unit and the delay setting value. The variable delay circuit 60 may preferably have the same or similar structure with or to the variable delay circuit 60 described with reference to FIGS. 2 to 5.

Since the testing apparatus of the fourth embodiment of the present invention uses a variable delay circuit of either one of the first to third embodiments of the present invention, it is possible to make the volume of the testing apparatus smaller. Further, it is also possible to provide a delay with high precision to the input signal inputted into the semiconductor circuit 76.

Although the present invention has been described by way of exemplary embodiments, it should be understood that those skilled in the art might make many changes and substitutions without departing from the spirit and the scope of the present invention which is defined only by the appended claims. According to the claims, it is apparent that the various modifications or changes are also within the technical scope of the present invention.

As apparent from the above description, according to the present invention, it is possible to reduce the volume of the table to be small or remove the table completely. Further, it is also possible to provide a variable delay circuit which can produce a delay with high precision compared to the conventional technology.

What is claimed is:

1. A variable delay circuit for delaying an input signal by a predetermined delay time determined according to a delay setting value and outputting said delay signal, comprising:
   a delay circuit unit comprising a plurality of paths, wherein said input signal passes through either one of said plurality of paths, and is outputted with a predetermined amount of delay for said one of said plurality of paths; and
   a control unit for receiving said delay setting value and selecting one path out of said plurality of paths based on said delay setting value and an offset delay amount corresponding to a delay amount of each of said plurality of paths, wherein said control unit selects a path of maximum offset delay amount out of said plurality of paths of which said offset delay amounts are equal to or smaller than said delay setting value by comparing said offset delay amounts of said plurality of paths with said delay setting value.

2. A variable delay circuit as claimed in claim 1, wherein delay amount of at least one of said plurality of paths is substantially zero (0).

3. A variable delay circuit as claimed in claim 1, wherein said delay circuit unit forms a plurality of cascaded delay circuit units with other delay circuit units,
   said control unit comprises a plurality of cascaded subtracting units, each of which is corresponding to each of said plurality of delay circuit units, and
   each of said subtracting units receives said delay setting value and outputs a value, calculated by subtracting said offset delay amount corresponding said path selected by said control unit from said delay setting value, as a delay setting value for a subtracting unit of the next stage.

4. A variable delay circuit as claimed in claim 3, herein the maximum delay amount of a delay circuit unit is smaller than the maximum delay amount of a delay circuit unit of the previous stage.

5. A variable delay circuit as claimed in claim 3, further comprising a plurality of offset delay amount memories for storing said offset delay amounts, each of said delay amount memories being corresponding to each of said plurality of delay circuit units.

6. A variable delay circuit as claimed in claim 5, wherein said offset delay amount memories store a plurality of said offset delay amounts, each of said offset delay amounts being corresponding to one or a plurality of selected paths of said plurality of delay circuit units in the upstream of said corresponding delay circuit unit, so that each of said plurality of offset delay amounts is corresponding to each of said plurality of paths of said corresponding delay circuit unit.

7. A variable delay circuit as claimed in claim 6, said control unit selects a path of said delay circuit unit out of said plurality of offset delay amounts stored by said offset delay amount memories based on said offset delay amount corresponding to a selected path of said delay circuit unit in the upstream.

8. A variable delay circuit as claimed in claim 5, further comprising:
   a micro variable delay circuit unit for receiving said input signal from a delay circuit unit in the down-most stream out of said plurality of delay circuit units, and outputting said input signal delayed for a predetermined very short time; and
   a table for storing data which controls said delay amount of said micro variable delay circuit unit,
   wherein said control unit controls said delay amount of said micro variable delay circuit unit based on said data stored by said table.

9. A variable delay circuit as claimed in claim 8, wherein said control unit controls said delay amount of said micro variable delay circuit unit based on calculation result of said subtracting unit corresponding to said delay circuit unit in the down-most stream.

10. A variable delay circuit as claimed in claim 1, wherein each of said plurality of delay circuit units comprises a first path having a first delay amount and a second path having a second delay amount, and said second delay amount is substantially zero (0).

11. A variable delay circuit as claimed in claim 10, wherein said control unit selects said first path in case said offset delay amount corresponding to said first delay amount is equal to or smaller than said delay setting value, and said second path in case said offset delay amount is larger than said delay setting value.

12. A testing apparatus for testing a semiconductor circuit comprising:

a signal generator for generating test signals;

a variable delay circuit for providing said test signals outputted from said signal generator with a predetermined timing, said variable delay circuit comprising:
- a delay circuit unit comprising a plurality of paths, wherein each of said test signal passes through either one of said plurality of paths, and is outputted with predetermined amount of delay for said one of said plurality of paths; and
- a control unit for receiving a delay setting value provided based on said timing and selecting one path out of said plurality of paths based on said delay setting value and an offset delay amount corresponding to a delay amount of each of said plurality of paths, wherein said control unit selects a path of maximum offset delay amount out of said plurality of paths of which said offset delay amounts are equal to or smaller than said delay setting value by comparing said offset delay amounts of said plurality of paths with said delay setting value, and a determining unit for determining whether or not said semiconductor circuit has passed a test based on outputted signals from said semiconductor circuit.

* * * * *